(12) United States Patent
Horie

(10) Patent No.: US 7,792,170 B2
(45) Date of Patent: Sep. 7, 2010

(54) SEMICONDUCTOR LASER

(75) Inventor: Hideyoshi Horie, Ushiku (JP)

(73) Assignee: Mitsubishi Chemical Corporation, Tokyo (JP)

( * ) Notice: Subject to any disclaimer, the term of this patent is extended or adjusted under 35 U.S.C. 154(b) by 445 days.

(21) Appl. No.: 11/082,906

(22) Filed: Mar. 18, 2005

(65) Prior Publication Data
US 2005/0213625 A1    Sep. 29, 2005

Related U.S. Application Data

(63) Continuation of application No. PCT/JP03/11488, filed on Sep. 9, 2003.

(30) Foreign Application Priority Data

Sep. 20, 2002 (JP) .............................. 2002-275917

(51) Int. Cl.
*H01S 5/068* (2006.01)
*H01S 5/20* (2006.01)

(52) U.S. Cl. .............. 372/44.01; 372/29.02; 372/45.01; 372/32

(58) Field of Classification Search .................. 372/32, 372/29.02, 43.01, 44.01, 45.01, 45.011
See application file for complete search history.

(56) References Cited

U.S. PATENT DOCUMENTS

| | | | | |
|---|---|---|---|---|
| 5,289,484 A | * | 2/1994 | Hayakawa | ................ 372/45.01 |
| 5,656,832 A | * | 8/1997 | Ohba et al. | .................. 257/190 |
| 5,815,521 A | * | 9/1998 | Hobson et al. | ........... 372/45.01 |
| 6,055,253 A | * | 4/2000 | Kidoguchi et al. | ........ 372/45.01 |
| 6,993,053 B2 | * | 1/2006 | Buda et al. | ................ 372/44.01 |
| 2001/0038657 A1 | * | 11/2001 | Kasukawa et al. | ............. 372/46 |

FOREIGN PATENT DOCUMENTS

| | | |
|---|---|---|
| JP | 61-156788 | 7/1986 |
| JP | 63-208290 | 8/1988 |
| JP | 7-249795 | 9/1995 |
| JP | 9-232692 | 9/1997 |
| JP | 2001-210910 | 8/2001 |

OTHER PUBLICATIONS

G. M. Smith et al., "Metallization to asymmetric cladding separate confinement heterostructure lasers," Appl. Phys. Lett. 67, 3847 (1995).*

(Continued)

*Primary Examiner*—Minsun Harvey
*Assistant Examiner*—Michael Carter
(74) *Attorney, Agent, or Firm*—Oblon, Spivak, McClelland, Maier & Neustadt, L.L.P.

(57) ABSTRACT

A semiconductor laser having an oscillation wavelength λ (nm) and comprising at least a substrate, a first-conduction-type clad layer having an average refractive index $N_{1cld}$, an active layer structure having an average refractive index $N_A$, and a second-conduction-type clad layer having an average refractive index $N_{2cld}$. This has a first-conduction-type sub-wave guide layer having an average refractive index $N_{1SWG}$ between the substrate and the first-conduction-type clad layer, and has a first-conduction-type low-refractive-index layer having an average refractive index $N_{1LIL}$ between the subwaveguide layer and the substrate. In this, the refractive indexes satisfy specific relational formulae. The semiconductor laser has a stable oscillation wavelength against the change of current/light output/temperature.

43 Claims, 8 Drawing Sheets

OTHER PUBLICATIONS

Iordache, "High power CW output from low confinement asymmetric structure diode laser," Electronics Letters, 1999, vol. 35, pp. 148-149.*

Hideyoshi Horie, et al., "Longitudinal-Mode Characteristics of Weakly Index-Guided Buried-Stripe Type 980-nm Laser Diodes with and without Substrate-Mode-Induced Phenomena", IEEE Journal of Quantum Electronics, vol. 36, No. 12, Dec. 2000, pp. 1454-1461.

U.S. Appl. No. 12/299,253, filed Oct. 31, 2008, Horie.
U.S. Appl. No. 12/299,318, filed Nov. 3, 2008, Horie.
U.S. Appl. No. 12/299,250, filed Oct. 31, 2008, Horie.

* cited by examiner

SEMICONDUCTOR LASER

The present application is a continuation of PCT/JP2003/011488 with a filing date of Sep. 9, 2003, which claims the priority from Japanese Patent Application No. 275917/2002 filed on Sep. 20, 2002.

BACKGROUND OF THE INVENTION

1. Field of the Invention

The present invention relates to a semiconductor laser. The semiconductor laser of the invention is applicable to all types of semiconductor lasers of which the oscillation wavelength changes owing to current/light output/temperature, etc.

2. Description of the Related Art

Remarkable progress has been made in recent technologies in optical information processing and optical communication. For example, to realize high-speed two-way communication by optical fiber networks for transmission of a large quantity of information such as image information, a large-quantity optical fiber transmission line and also a signal amplifier flexible to the transmission line are indispensable. As one typical example of the case, studies of an optical fiber amplifier doped with a rare earth element such as $Er^{3+}$ (EDFA) are now made in various fields. With that, it is desired to develop an excellent semiconductor laser for an excitation light source, which is an indispensable element as a component of EDFA.

In principle, the oscillation wavelength of the excitation light source applicable to EDFA includes three, 800 nm, 980 nm and 1480 nm. Of those, it is known that the excitation at 980 nm is the most desirable in view of the properties of the amplifier and in consideration of gains and/or noise figures thereof. A laser having such an oscillation wavelength band of 980 nm has been realized by providing an active layer of InGaAs on a GaAS substrate, and it must satisfy two contradictory requirements that its output power is high and its life is long. Further, SHG light sources and others require the wavelength around it of, for example, from 890 nm to 1150 nm, and the development of lasers having excellent properties is desired in other various application fields.

In the field of information processing technology, short-wave semiconductor lasers are being developed for attaining high-density data storage. In particular, the recent development of blue lasers is remarkable, and the reliability of a GaN material grown on an $AlO_x$ or the like substrate is increasing, and further studies are now being made on these. Further, semiconductor lasers are applied to the field of medicine and also to the field of precision fabrication, and their application range will further increase in future.

In general, semiconductor lasers are small-sized and light-weight as compared with solid lasers and gas lasers, and they have many applications owing to such their advantages. However, semiconductor lasers are not always superior to any other laser light sources from the standpoint of the wavelength stability thereof. For example, in an ordinary Fabry-Perot semiconductor laser in which the facet reflection is the basis of the cavity constitution thereof, the oscillation wavelength generally increases with the increase in the device temperature. This is because the band gap of the material that constitutes the semiconductor laser reduces at high temperatures, and it may be said that the characteristic of the device is basically intrinsic to the constitutive material thereof. When the device is driven for high output power operation, or that is, when the input current to the device is increased, then the oscillation wavelength of the semiconductor laser may generally increase owing to the heat generation by the device. In general, it is desired that the wavelength fluctuation in semiconductor lasers depending on temperature/light output/input current changes is as small as possible, and it is desired to solve the problem.

Various attempts have been made for providing semiconductor lasers with small wavelength change. For example, as so described in H. C. Casey, Jr., M. B. Panish, *Hetero-structure Lasers* (Academic Press, 1978), pp. 90-106, it has been known that a semiconductor laser (DFB laser) with stabilized oscillation wavelength could be produced by forming a periodical grating structure, as built in around the active layer of the device, and using it as a distributional reflector. Another method of wavelength stabilization has been employed broadly, which comprises forming an external cavity structure for a semiconductor laser, and in which the light having a specific wavelength of the outputted light from the semiconductor laser is selectively reflected and it is inputted into the device. However, the former requires the formation of a periodic grating structure inside the device, and therefore has some drawbacks in that the process is complicated and the device is unsuitable to high output driving operation. The latter requires an external cavity structure and the light source is therefore large-sized as a whole, and its problem is that it loses the advantage of small-sized semiconductor laser body.

On the other hand, in the present inventor's report, IEEE Journal of Quantum Electronics, Vol. 36, No. 12, December (2000), pp. 1454-1461, a semiconductor laser at a 980 nm band is formed on a substrate transparent to a light having the oscillation wavelength thereof. Precisely, in this, when the refractive index of the substrate is relatively larger than that of the clad layer, or that is, when a substrate capable of expressing a waveguide function exists under a semiconductor laser waveguide that is intentionally formed in the device, and when the laser waveguide is coupled to the substrate waveguide, then (1) depending on the substrate thickness, the device oscillation spectrum includes intensity modulation irrespective of the Fabry-Perot mode spacing defined by the cavity length of the device (FIG. 4 in the reference); (2) the intensity modulation period is 2.5 nm or so when the substrate has an ordinary thickness (120 μm or so); and (3) in that situation, the current dependency/temperature dependency of the longitudinal-mode that shows the maximum intensity in the oscillation spectrum of the device exhibits step-like specific characteristics (FIG. 7 and FIG. 11 in the reference). As in FIG. 7, these characteristics include a region in which the current dependency of the oscillation wavelength is extremely small in an extremely minor region thereof, and this characteristic gives some suggestion for wavelength stabilization of semiconductor lasers.

In addition, in the reference, the wavelength stabilization mechanism is discussed. In general, the spectrum of the gain generated by current injection into the waveguide, that is built in as a semiconductor laser, moves toward the long wavelength side along with the increase in input current/light output/temperature. This is the reason of wavelength change in ordinary semiconductor lasers. Hereinafter, the phenomenon, which expresses wavelength shift toward the long-wavelength direction is referred to as "red-shift". However, when a semiconductor laser is formed on a substrate transparent to a light having the oscillation wavelength and when the refractive index of the substrate is relatively larger than that of the clad layer, then a mechanism of inhibiting wavelength change is created inside the substrate. In the substrate that expresses the function as a waveguide, no stimulated emission occurs and therefore the inputted carrier is accumulated therein. In general, the refractive index of a semiconductor material decreases with the increase in the carrier density thereof. This phenomenon is known as a plasma effect. Accordingly, on the intensity modulation in the oscillation spectrum that is generated as a result of coupling of a laser waveguide and a substrate waveguide, and on the longitudinal-mode selected according to the result, the wavelength-shortening mechanism shall act through current injection. Hereinafter, the phenomenon, which expresses wavelength shift toward the short-wavelength direction is referred to as "blue-shift". Specifically, it may be understood that the wavelength stabilized region seen in FIG. 7 in the above-mentioned reference, IEEE Journal is a result that is realized by the "balance" of the effect of the gain spectrum incidental to the laser waveguide of which the wavelength is red-shifted as a result of current injection, and the effect derived from the substrate waveguide of which the wavelength is shortened by the plasma effect. Regarding the temperature dependency, since the effect of red-shift of the oscillation wavelength owing to increase of the refractive index of the substrate due to temperature increase is smaller than the effect of red-shift of the oscillation wavelength owing to the reduction in the band gap of the active layer due to temperature increase, it is possible to inhibit the effect of the gain spectrum of the laser waveguide of which the wavelength is red-shifted as a result of the temperature increase.

However, in the above-mentioned system, the region in which the wavelength is stable to the current change is narrow, as in FIG. 7 of the above-mentioned IEEE Journal reference, and there is a problem in that an extremely large wavelength change occurs before and after the stabilized region. For solving it, however, it is difficult to control the waveguide mechanism of the substrate. This is because of the following reasons: The substrate plays a role as an underground for epitaxial crystal growth thereon in forming an LD structure, and, in addition to it, the substrate must be thick enough to ensure the mechanical strength thereof so as to protect wafers from being broken in a process of producing semiconductor lasers, and, on the contrary, it will have to be thin to such a degree that it could be cleaved to form semiconductor laser facets. Accordingly, the overall thickness of the device will have to be defined to finally fall between around 100 μm and 150 μm or so. Even when the optically-optimum thickness of the substrate is 40 μm, it is really impossible to handle the substrate of the type.

SUMMARY OF THE INVENTION

The invention is to solve the problems with the related art mentioned above. Concretely, an object of the invention is to provide a method of reducing the current dependency, the light output dependency or the temperature dependency of the oscillation wavelength of a semiconductor laser within a relatively broad current region/light output region or temperature region, in a simplified manner.

We, the present inventors have assiduously studied for solving the problems and, as a result, have found that these problems can be solved by the invention that relates to a semiconductor laser having an oscillation wavelength λ (nm) and comprising at least a substrate, a first-conduction-type clad layer having an average refractive index $N_{1cld}$, an active layer structure having an average refractive index $N_A$, a second-conduction-type clad layer having an average refractive index $N_{2cld}$, wherein a first-conduction-type subwaveguide layer having an average refractive index $N_{1SWG}$ is present between the substrate and the first-conduction-type clad layer, and a first-conduction-type low-refractive-index layer having an average refractive index $N_{1LIL}$ is present between the subwaveguide layer and the substrate, and these refractive indexes satisfy all the following formulae:

$N_{1cld} < N_A$, $N_{2cld} < N_A$, $N_{1cld} < N_{1SWG}$, $N_{2cld} < N_{1SWG}$, $N_{1LIL} < N_{1SWG}$.

Preferred embodiments of the invention are mentioned below. Preferably, the refractive indexes satisfy all the following formulae:

$N_{1LIL} \leq N_{1cld}$, $N_{1LIL} \leq N_{2cld}$.

Also preferably, the thickness $T_{1cld}$ (nm) of the first-conduction-type clad layer of the semiconductor laser of the invention and the thickness $T_{2cld}$ (nm) of the second-conduction-type clad layer thereof satisfy the following formulae:

$0.5 < T_{1cld}/\lambda < 3.0$, $T_{1cld} < T_{2cld}$.

Also preferably, the thickness $T_{1SWG}$ (nm) of the first-conduction-type subwaveguide layer of the semiconductor laser of the invention satisfies the following formula:

2000 (nm) < $T_{1SWG}$ < 40000 (nm).

Also preferably, the thickness $T_{1LIL}$ (nm) of the first-conduction-type low-refractive-index layer of the semiconductor laser of the invention satisfies the following formula:

500 (nm) < $T_{1LIL}$ < 20000 (nm)

Also preferably, the thickness $T_{sub}$ (nm) of the substrate of the semiconductor laser of the invention satisfies the following formula:

75000 (nm) < $T_{SUB}$ < 135000 (nm)

In one preferred embodiment of the semiconductor laser of the invention, the substrate is transparent to a light having the oscillation wavelength λ (nm) Preferably, the refractive index $N_{sub}$ of the substrate of the case satisfies the following formula.

$N_{1LIL} < N_{sub}$.

In another preferred embodiment of the invention, the substrate absorbs a light having the oscillation wavelength λ (nm).

Still another preferred embodiment of the semiconductor laser of the invention is an edge-emission-type device having a facet-reflection-type cavity structure.

Still another preferred embodiment of the semiconductor laser of the invention comprises a first optical guide having a refractive index $N_{1MWG}$ between the first-conduction-type clad layer and the active layer structure, and a second optical guide layer having a refractive index $N_{2MWG}$ between the active layer structure and the second-conduction-type clad layer, wherein these refractive indexes satisfy all the following formulae:

$N_{1cld} < N_{1MWG} < N_A$, $N_{2cld} < N_{1MWG} < N_A$, $N_{1cld} < N_{2MWG} < N_A$, $N_{2cld} < N_{2MWG} < N_A$.

Preferably, the semiconductor laser of the type as above satisfies all the following formulae:

$$N_{1SWG} \leq N_{1MWG},$$

$$N_{1SWG} \leq N_{2MWG}.$$

Also preferably, the refractive index $N_{SUB}$ of the substrate at the laser oscillation wavelength λ (nm) satisfies at least one of the following formulae:

$$N_{SUB} = N_{1SWG},$$

$$N_{SUB} = N_{1MWG},$$

$$N_{SUB} = N_{2MWG},$$

$$N_{1SWG} = N_{1MWG},$$

$$N_{1SWG} = N_{2MWG},$$

$$N_{1MWG} = N_{2MWG}.$$

Still another preferred embodiment of the semiconductor laser of the invention is as follows: The second-conduction-type clad layer consists of an upper second-conduction-type clad layer and a lower second-conduction-type clad layer, and the upper second-conduction-type clad layer and a current block layer form a current injection region, and it further includes a contact layer.

Preferably, the semiconductor laser of the invention is for a single transverse-mode operation. Also preferably, in the semiconductor laser of the invention, the first conduction type is an n-type and the conduction type is a p-type.

Figure 1:
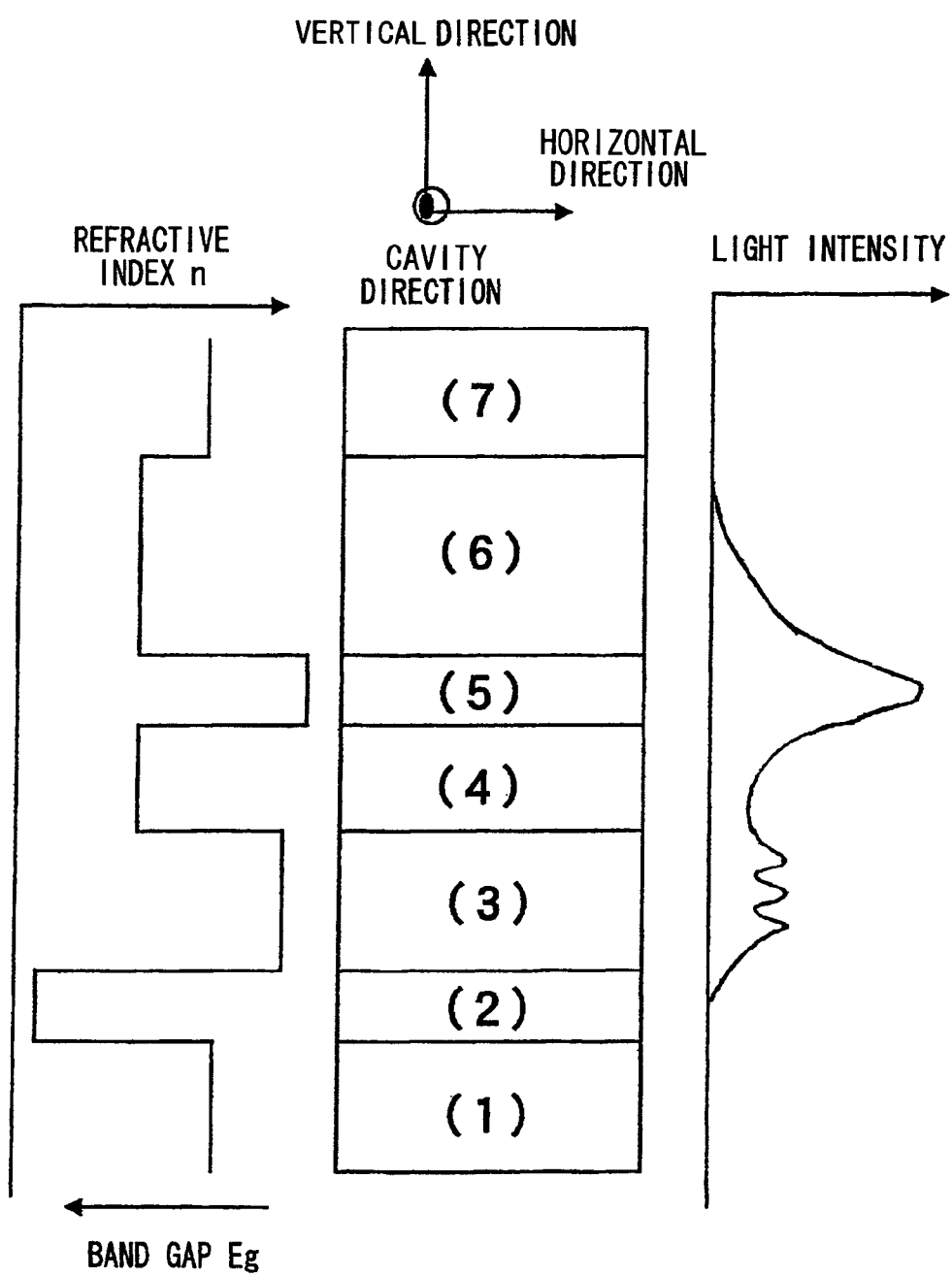
FIG. 1 shows an example of a basic layer constitution of the semiconductor laser of the invention in the center thereof; an example of the refractive index profile according to the invention on the left side thereof; an example of the light intensity profile expected in the invention on the right side thereof; and the meaning of the wording, vertical direction/horizontal direction/cavity direction as referred to in this description, at the top thereof.

In the drawings, 1 is a substrate, 2 is a first-conduction-type low-refractive-index layer, 3 is a first-conduction-type subwaveguide layer, 4 is a first-conduction-type clad layer, 5 is an active layer structure, 6 is a second-conduction-type clad layer, 7 is a second-conduction-type contact layer, 11 is a first-conduction-type substrate, 12 is a first-conduction-type buffer layer, 13 is a first-conduction-type low-refractive-index layer, 14 is a first-conduction-type subwaveguide layer, 15 is a first-conduction-type clad layer, 16 is a first optical guide layer, 17 is an active layer structure, 18 is a second optical guide layer, 19 is a lower second-conduction-type clad layer, 20 is a first-conduction-type current block layer, 21 is a cap layer, 22 is an upper second-conduction-type clad layer, 23 is a second-conduction-type contact layer, 101 is a strained quantum well layer, 102 is a barrier layer, 103 is a strained quantum well layer, 201 is a substrate-side (first-conduction-type-side) electrode, 202 is an epitaxial layer-side (second-conduction-type-side) electrode.

MODE FOR CARRYING OUT THE INVENTION

The semiconductor laser of the invention is described in detail hereinunder. The semiconductor laser of the invention is not specifically defined in point of the details of its structure and of the production method for it, so far as it satisfies the condition of claim 1. In this description, the numerical range expressed by the wording "from A to B" means the range that includes A and B.

With reference to FIG. 1, the mechanism of wavelength stabilization of the semiconductor laser of the invention is described. In its center, FIG. 1 shows a constitution of substrate (1)/first-conduction-type low-refractive-index layer (2)/first-conduction-type subwaveguide layer (3)/first-conduction-type clad layer (4)/active layer structure (5)/second-conduction-type clad layer (6) laminated on the substrate and indispensable to the invention, and this has a second-conduction-type contact layer (7) favorably used in constituting the semiconductor laser. In the following description, the substrate is a first-conduction-type substrate. On the left thereof, FIG. 1 shows an example of the refractive index profile according to the invention. A high-refractive-index semiconductor material generally have a narrow band gap, and the band gap trend is also shown in FIG. 1. On the right side thereof, FIG. 1 shows an example of the light intensity profile expected in the invention. At the top thereof, FIG. 1 shows the meaning of the wording, vertical direction/horizontal direction/cavity direction as referred to in this description.

Basically, light confinement in the vertical direction of the semiconductor laser is attained by light focusing around the active layer structure sandwiched between the first-conduction-type clad layer and the second-conduction-type clad layer, both of which have a relatively low refractive index. In this, electrons or holes are injected from the respective clad layers having a different conduction type, and at around the active layer structure having a relatively high refractive index and having a narrow band gap, the interaction between light and carrier is effectively attained to generate a gain. In the following description, the part that comprises first-conduction-type clad layer/active layer structure/second-conduction-type clad layer and has a function of an ordinary semiconductor laser is referred to as "laser waveguide" for convenience sake. In the invention, the laser waveguide part is basically the same as in conventional devices.

On the other hand, one characteristic feature of the invention is that a first-conduction-type subwaveguide layer is intentionally positioned on the first-conduction-type substrate side of the first-conduction-type clad layer. The first-conduction-type subwaveguide layer is sandwiched between the first-conduction-type clad layer having a relatively low refractive index and the first-conduction-type low-refractive-index layer, and therefore it functions as a waveguide layer. Further, since the first-conduction-type low-refractive-index layer/first-conduction-type subwaveguide layer/first-conduction-type clad layer all have the same conduction type, the subwaveguide layer does not serve as a gain-generating waveguide like the active layer, but serves as a waveguide having a passive function. In the following description, the passive waveguide part that comprises the first-conduction-type low-refractive-index layer/first-conduction-type subwaveguide layer/first-conduction-type clad layer is referred to as "subwaveguide" for convenience sake for simple expression.

It may be understood that the subwaveguide is an independent layer structure that is intentionally epitaxially grown for the purpose of controlling the function of the substrate waveguide, which the present inventors have clarified in the above-mentioned reference, IEEE Journal. Accordingly, the wavelength stabilization of the semiconductor laser in the invention is for controlling the red-shift of the gain spectrum by current injection, owing to the plasma effect of reducing the refractive index of the first-conduction-type subwaveguide layer. Regarding the temperature dependency, since the effect of red-shift of the oscillation wavelength owing to increase of the refractive index of the first-conduction-type subwaveguide layer by temperature increase is smaller than the effect of red-shift of the oscillation wavelength owing to the reduction in the band gap of the active layer with the temperature increase thereof, it is possible to inhibit the red-shift of the gain spectrum that is generated in the laser waveguide.

Figure 7:
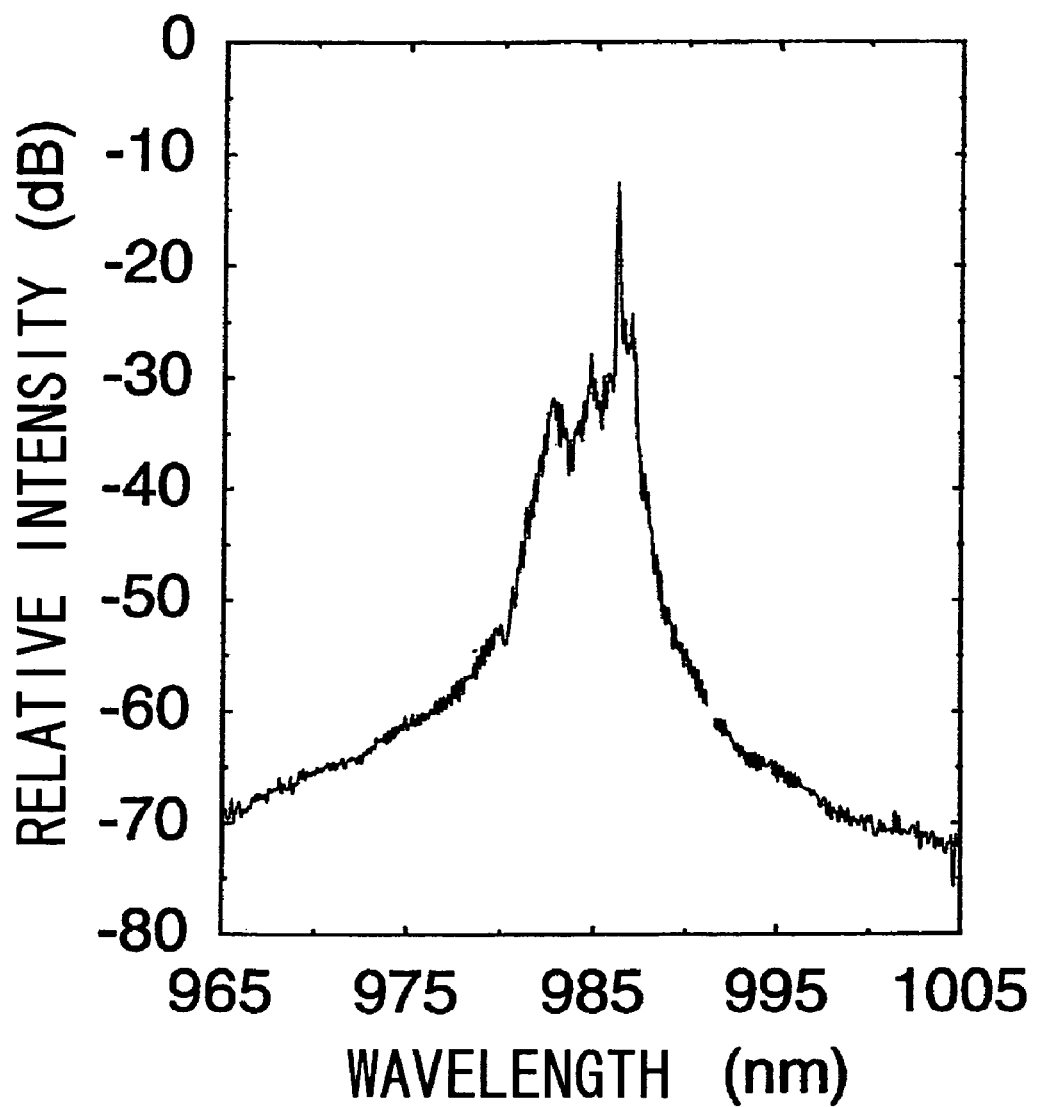
FIG. 7 is an oscillation spectrum of the semiconductor laser of Comparative Example 2.

Further in the invention, it is possible to change the range of the current injection region in which the wavelength is stabilized, as seen in FIG. 7 in the above-mentioned IEEE Journal, by changing the thickness of the epitaxially-grown, first-conduction-type subwaveguide layer. Regarding the temperature dependency, it is possible to enlarge the region in which the temperature dependency is relatively small, as seen in FIG. 11 in the above-mentioned IEEE Journal.

Figure 4:
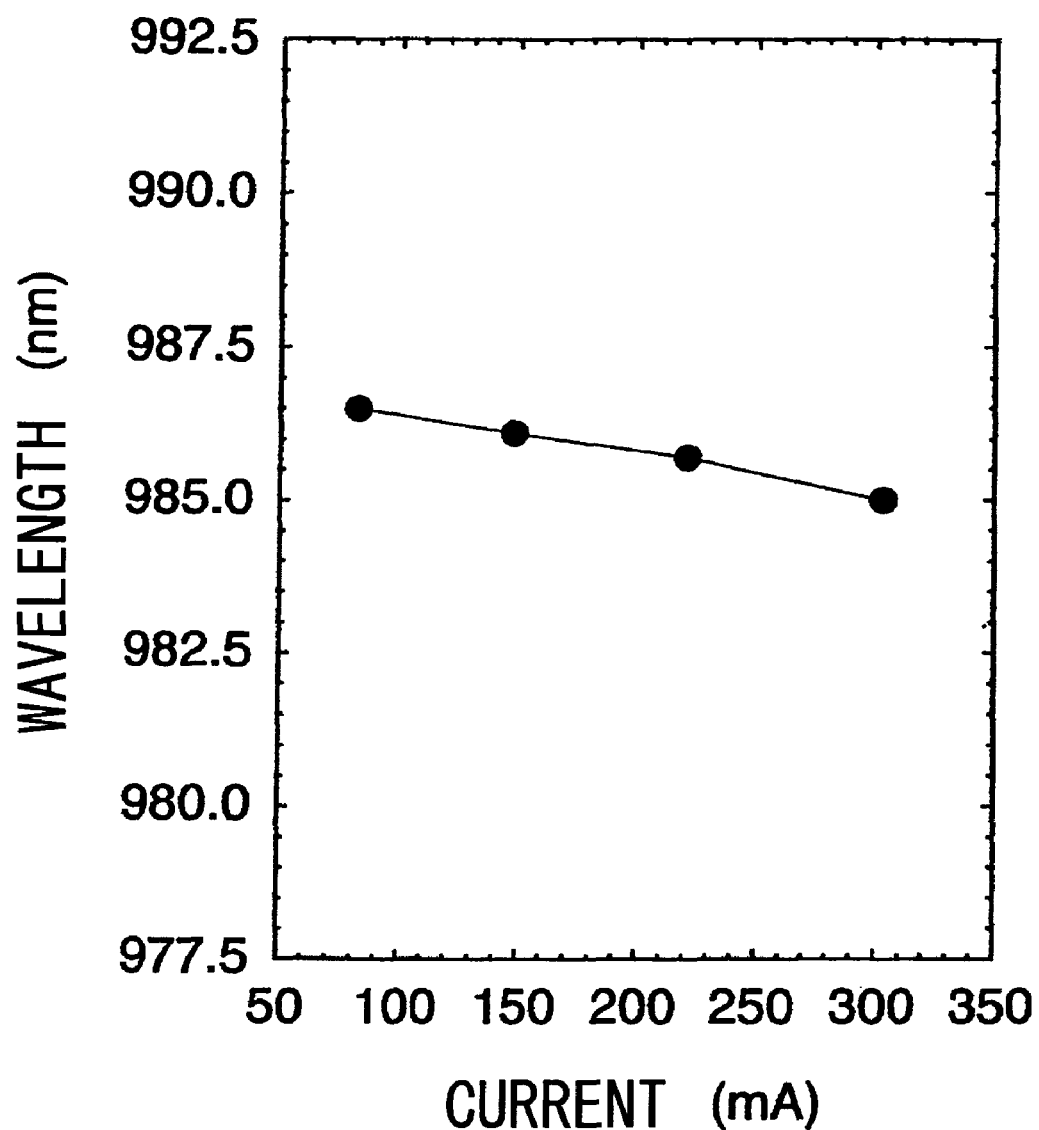
FIG. 4 is a graph showing the current dependency of the longitudinal-mode wavelength that shows the maximum intensity in the oscillation spectrum of the semiconductor laser of Example.

Concretely, the thickness of the subwaveguide layer and the intensity modulation period seen in the oscillation spectrum of a device is in inverse proportion to each other. Therefore, for example, when the thickness of the first-conduction-type subwaveguide layer is 20 μm and when the same 980 nm-band semiconductor laser as in the above-mentioned report is produced according to the invention, then the intensity modulation period could be 15 nm or so. As a result, the longitudinal-mode that shows the highest strength of some longitudinal-modes produced as a result of the intensity modulation in the oscillation spectrum, as seen in FIG. 4 in the above-mentioned IEEE Journal, does not easily move to the adjacent longitudinal-mode even when the gain spectrum of the semiconductor laser is shifted to the long wavelength side (red-shift direction) along with current injection into the device. Accordingly, the oscillation wavelength of the device could be stabilized in a broader current region than in a case where it is stabilized owing to the effect of a thick substrate waveguide having a thickness of, for example 120 μm or so. Further, when the thickness of the first-conduction-type subwaveguide layer is suitably selected, then it may be possible to set the substantial intensity modulation period more broadly than the range of the gain spectrum of the semiconductor laser. In this case, only one longitudinal-mode selected as a result of the intensity modulation appears in the oscillation spectrum of the device, and the intensity modulation period is not apparently observed. This indicates the possibility of producing semiconductor lasers of extremely good monochromaticity.

Another characteristic feature of the invention is that the passive waveguide function is made independent of the substrate whereby the wavelength-stabilized region, as seen in FIG. 7 in the above-mentioned IEEE Journal, can be produced in a broad current injection region irrespective of the relative relationship between the substrate and the oscillation wavelength. For this, it is important to sufficiently prevent the light propagating through the subwaveguide layer from leakage out into the first-conduction-type substrate. As in FIG. 1, the first-conduction-type low-refractive-index layer disposed between the first-conduction-type substrate and the first-conduction-type subwaveguide layer plays an important role so as to prevent the laser waveguide and the subwaveguide, coupling to each other, from optical coupling to the substrate.

If not according to the invention, the characteristics as in FIG. 7 or FIG. 11 in the above-mentioned IEEE Journal could not be expressed in the absence of a case where the substrate is transparent to a light having the oscillation wavelength and the refractive index of the substrate is relatively higher than that of the clad layer, or that is, in the absence of such a specific condition where a waveguide function-expressing substrate exists under the intentionally built-in semiconductor laser waveguide and where the laser waveguide couples to the substrate waveguides. For example, a 980 nm-band semiconductor laser having a relatively thin clad layer and an InGaAs active layer formed on a GaAs substrate is an example of this case. However, according to the invention, even a semiconductor laser that has an AlGaAs active layer formed on a GaAs substrate in which the band gap of the substrate is smaller than the oscillation wavelength of the device and the substrate serves as an absorbent for a light having the oscillation wavelength, or even a semiconductor laser having an InGaAsP active layer on an InP substrate in which the substrate itself is transparent to a light having the oscillation wavelength and expresses the function as a clad layer could realize a device in which the current dependency/light output dependency/temperature dependency of the wavelength is small. The degree of coupling between the laser waveguide and the subwaveguide can be controlled, depending on the thickness of the first-conduction-type clad layer, and on the relative refractive index difference between the laser waveguide and the subwaveguide. When the intentionally built-in two waveguides are suitably coupled to each other, then it is possible to realize a device in which the current dependency/light output dependency/temperature dependency of the wavelength is small.

The invention is described in more detail with reference to FIG. 2 that shows a schematic cross-sectional view of one example of the semiconductor laser of the invention. As in FIG. 2, the second-conduction-type clad layer having a refractive-index-guided structure and having a conduction type different from that of the substrate consists of two layers, an upper second-conduction-type clad layer and a lower second-conduction-type clad layer, and the upper second-conduction-type clad layer and a current block layer form a current injection region. This is a single transverse-mode-operational device additionally having a contact layer for lowering the contact resistance to the electrode. In this example described below, the first conduction type is referred to as n-type; and the second conduction type is referred to as p-type. The polarity of each layer does not restrict the invention. Each layer may be partly undoped, or may be partly a first conduction type or a second conduction type. Unless otherwise specifically indicated, the refractive index of each layer means the refractive index at the oscillation wavelength of the device, and when a functional layer is composed of plural layers or when it has a super-lattice structure, then the refractive index of the layer is given by dividing the sum total of the product of the refractive index and the thickness of every layer, by the sum total of the thickness of every layer, followed by averaging the resulting data. In particular, the invention remarkably exhibits its effect when applied to a semiconductor laser that operates in a single transverse-mode. This is because the monochromaticity of the oscillation spectrum of the device that operates in a single transverse-mode is remarkably excellent as compared with a device not having a transverse-mode control function.

For the first-conduction-type substrate (11), used is a single-crystal substrate of GaAs, InP or GaN from the viewpoint of the desired oscillation wavelength, the lattice matching, the stress to be intentionally introduced into the active layer, and the stress compensation of the active layer used as a guide layer or the like.

For the substrate, not only a just-oriented substrate but also a miss-oriented substrate is usable from the viewpoint of improving the crystallinity in epitaxial growth. The miss-oriented substrate has an effect of promoting the crystal growth in a step-flow mode, and is widely used. The miss-oriented substrate widely used in the art has an inclination of from 0.5 to 2 degrees or so, but its inclination could be around 10 degrees depending on the material system to constitute a quantum well structure. The substrate may be previously subjected to chemical etching or heat treatment for producing semiconductor lasers according to crystal growth technology of MBE or MOCVD.

The substrate may absorb the light having the oscillation wavelength defined by the active layer structure, or may be transparent. Anyhow, the invention is applicable to any of those substrates in any desired manner. This is because the optical properties of the substrate may be disregarded owing to the first-conduction-type low-refractive-index layer that will be mentioned hereinunder. Accordingly, the final thickness of the substrate may be defined within a range that sufficiently ensures the mechanical strength of the substrate in production of semiconductor laser structures and that does not detract from the cleavability thereof. Preferably, it falls between 75 and 135 μm, more preferably between 95 and 125 μm.

The buffer layer (12) is preferably a first conduction type when the substrate is a first conduction type. It is desirable that the buffer layer is provided for relaxing the incompleteness of bulk crystal and for facilitating the formation a thin epitaxial film having the same crystal axis. Preferably, the first-conduction-type buffer layer is formed of the same compound as that for the first-conduction-type substrate. When the substrate is GaAs, then, in general, GaAs is used for the buffer layer. In this case, the buffer layer may be treated in the same manner as the substrate optionally. However, a superlattice layer is also widely used as a buffer layer. Accordingly, the buffer layer may not be formed of the same compound as that of the substrate. In some case, a material that differ from that of the substrate may be selected for the buffer layer, in view of the desired emission wavelength and the overall structure of the device. Such a buffer layer that differs from the substrate in point of the structure and the material may function as the first-conduction-type low-refractive-index layer. In this case, the refractive index $N_{buf}$ of the buffer layer at the oscillation wavelength may be equivalent to the refractive index $N_{1LIL}$ of the first-conduction-type low-refractive-index layer.

The first-conduction-type low-refractive-index layer (13) is disposed between the substrate and the first-conduction-type subwaveguide layer, and this realizes light confinement in the subwaveguide layer, and it plays an important role so as not to optically couple, the laser waveguide (in this case, this is composed of first-conduction-type clad layer/first optical guide layer/active layer structure/second optical guide layer/second-conduction-type clad layer) and the subwaveguide (this is composed of first-conduction-type low-refractive-index layer/first-conduction-type subwaveguide layer/first-conduction-type clad layer) optically coupled to each other, to the first-conduction-type substrate. For these purposes, the refractive index $N_{1LIL}$ of the first-conduction-type low-refractive-index layer at the oscillation wavelength must satisfy the following condition for the refractive index $N_{1SWG}$ of the subwaveguide:

$N_{1LIL} < N_{1SWG}$.

In addition, it is desirable that the refractive index $N_{1cld}$ of the first-conduction-type clad layer and the refractive index $N_{2cld}$ of the second-conduction-type clad layer satisfy the following:

$N_{1LIL} < N_{1cld}$, $N_{1LIL} < N_{2cld}$.

In particular, the following:

$N_{1LIL} = N_{1cld} = N_{2cld}$ is the most desirable as facilitating the production of devices. When the second-conduction-type clad layer consists of a lower clad layer and an upper clad layer as in the embodiment illustrated herein, the refractive index $N_{2cld}$ of the second-conduction-type clad layer is given by dividing the sum total of the product of the refractive index and the thickness of every layer, by the sum total of the thickness of every layer, followed by averaging the resulting data. When the first-conduction-type substrate is transparent to a light having the oscillation wavelength and when its refractive index is represented by $N_{sub}$, then it is desirable that the constitution satisfies the following:

$N_{1LIL} < N_{sub}$.

The thickness of the first-conduction-type low-refractive-index layer may be suitably selected so as to realize light confinement in the subwaveguide layer and so as not to optically couple, the laser waveguide and the subwaveguide optically coupled to each other, to the first-conduction-type substrate. However, the thickness $T_{1LIL}$ (nm) of the layer preferably satisfies the following:

500 (nm) < $T_{1LIL}$ < 20000 (nm).

If extremely thin, the low-refractive-index layer could not attain the above-mentioned function; but if unnecessarily thick, it is unfavorable since the series resistance in the device may increase. The first-conduction-type low-refractive-index layer may be a single-layered low-refractive-index layer, but may have a super-lattice structure constructed by laminating layers that are sufficiently thin as compared with the oscillation wavelength.

The first-conduction-type subwaveguide layer (14) is positioned between the first-conduction-type low-refractive-index layer and the first-conduction-type clad layer, and it has the function of guiding the light having suitably leaked out from the first-conduction-type clad layer. To realize this function, the refractive index $N_{1SWG}$ of the first-conduction-type subwaveguide layer must satisfy the following, relative to the refractive index $N_{1LIL}$ of the first-conduction-type low-refractive-index layer and the refractive index $N_{1cld}$ of the first-conduction-type clad layer:

$N_{1LIL} < N_{1SWG}$, $N_{1cld} < N_{1SWG}$.

Further, it must satisfy the following, relative to the refractive index $N_{2cld}$ of the second-conduction-type clad layer that constitute the laser waveguide.

$$N_{2cld} < N_{1SWG}.$$

The thickness of the first-conduction-type subwaveguide layer may be suitably selected, depending on the region in which the oscillation wavelength is desired to be stabilized against the current change in the device, on the oscillation wavelength of the device and on the material of the first-conduction-type subwaveguide layer itself. In general, as a result of coupling of the laser waveguide to the subwaveguide, the intensity modulation period seen in the oscillation spectrum is in inverse proportion to the thickness of the first-conduction-type subwaveguide layer. Therefore, in the semiconductor laser having an ordinary Fabry-Perot cavity, it is desirable that the thickness $T_{1SWG}$ (nm) of the first-conduction-type subwaveguide layer satisfies the following:

$$2000 \text{ (nm)} < T_{1SWG} < 40000 \text{ (nm)}$$

As is obvious from this point, the mode that propagates through the subwaveguide layer may be a higher-order mode of which order is relatively high in many cases, in consideration of the oscillation wavelength of the device.

A part or all of the first-conduction-type subwaveguide layer may be formed of a super-lattice structure or the like. Further, a part or all of the first-conduction-type subwaveguide layer may be undoped, in principle.

The first-conduction-type clad layer (15) is an element to constitute the laser waveguide and the subwaveguide, and in addition, it plays a role of controlling the coupling of the two waveguides. To constitute the laser waveguide, the refractive index $N_{1cld}$ of the first-conduction-type clad layer must satisfy the following, relative to the average refractive index $N_A$ of the active layer structure:

$$N_{1cld} < N_A.$$

In addition, to constitute the subwaveguide, the refractive index $N_{1cld}$ of the first-conduction-type clad layer must satisfy the following, relative to the refractive index $N_{1SWG}$ of the first-conduction-type subwaveguide layer:

$$N_{1cld} < N_{1SWG}.$$

Still further, regarding the thickness $T_{1cld}$ (nm) of the first-conduction-type clad layer relative to the relative relationship between the laser waveguide and the subwaveguide, the thickness thereof may be suitably selected so as to couple the two waveguides to each other, and the layer may be thin in order to realize strong coupling of the two but may be thick in order to realize weak coupling thereof. From this viewpoint, the thickness of the layer as defined relative to the oscillation wavelength λ (nm), $T_{1cld}/\lambda$ preferably satisfies the following:

$$0.5 < T_{1cld}/\lambda < 3.0.$$

A part of the first-conduction-type clad layer may be undoped, and the doping level in the layer may vary. It is not always necessary that the first-conduction-type clad layer and the second-conduction-type clad layer have a single-layered structure for realizing various light confinement in the laser waveguide, and the layers may have a multi-layered structure. The first-conduction-type clad layer may partly have a super-lattice structure.

The active layer structure in the invention is meant to include a single-layered bulk active layer, a single-layered quantum well active layer, a double quantum well structure that comprises two quantum well active layers separated by one or more barrier layers, and a multiple quantum well structure that comprises three or more quantum well active layers separated by barrier layers. In general, a optical guide layer is used for the active layer structure having a quantum well layer. In this description, however, the concept of the active layer structure does not include a optical guide layer.

The active layer structure (17) must constitute the laser waveguide along with the first-conduction-type clad layer and the second-conduction-type clad layer, and therefore, the average refractive index $N_A$ of the active layer structure must satisfy the following relationship relative to the refractive index $N_{1cld}$ of the first-conduction-type clad layer and the refractive index $N_{2cld}$ of the second-conduction-type clad layer.

$$N_{1cld} < N_A,$$

$$N_{2cld} < N_A.$$

Preferably, the active layer structure is not a bulk active layer but includes a quantum well active layer, as it is suitable for increasing the output power of the device. In particular, when the substrate is GaAs, then it is desirable that the active layer structure includes an AlGaAs quantum well layer, an InGaP quantum well layer, an InGaAs strained quantum well layer, or an InAlGaAs strained quantum well. In particular, the active layer structure that includes the strained quantum well layer with compressive stress intrinsically therein, such as InGaAs or InAlGaAs, is extremely preferable since it may be effective for lowering the threshold current of the device. FIG. 2 shows a condition in which two strained quantum well layers (101, 103) each formed of InGaAs are separated by a barrier layer (102). When the substrate is InP, then it is desirable that the active layer structure includes an InGaAsP quantum well layer or an InAlGaAs quantum well layer.

The active layer structure may have any desired conduction type. In particular, when the structure includes a quantum well active layer, then it is desirable that the quantum well layer is undoped and a first-conduction-type Si-containing part exists in the barrier layer. The embodiment of the type is preferable since electrons may be fed from the doped Si in the barrier layer into the quantum well layer and the gain spectrum of the device may be broad-banded.

The constitution of the active layer structure and the thickness of each layer constituting the structure may be suitably defined in any desired manner. When a quantum well layer is in the active layer structure, then it is desirable that a first optical guide layer (16) and a second optical guide layer (18) exist both sides of the layer. In this case, the first optical guide layer and the second optical guide layer constitute the laser waveguide along with the first-conduction-type clad layer/active layer structure/second-conduction-type clad layer. Accordingly, it is desirable that the refractive index $N_{1MWG}$ of the first optical guide layer and the refractive index $N_{2MWG}$ of the second optical guide layer satisfy the following:

$$N_{1cld} < N_{1MWG} < N_A,$$

$$N_{2cld} < N_{1MWG} < N_A,$$

$$N_{1cld} < N_{2MWG} < N_A,$$

$$N_{2cld} < N_{2MWG} < N_A.$$

Preferably, the refractive index of the first optical guide layer and that of the second optical guide layer satisfy the following, relative to the refractive index of the first-conduction-type subwaveguide layer.

$$N_{1SWG} \leq N_{1MWG},$$

$$N_{1SWG} \leq N_{2MWG}.$$

Also preferably, the refractive index of the first optical guide layer is the same as that of the second optical guide layer to ensure the symmetrical configuration of the waveguides. It is also desirable that the refractive indexes of the two layer are also the same as the refractive index of the first-conduction-type subwaveguide layer. When the substrate is GaAs and when the active layer structure includes an InGaAs strained quantum well active layer, it is also desirable that both the first optical guide layer and the second optical guide layer are formed of GaAs. From these, it is desirable that the semiconductor laser of the invention satisfies at least one of the following:

$N_{SUB}=N_{1SWG}$, $N_{SUB}=N_{1MWG}$, $N_{SUB}=N_{2MWG}$, $N_{1SWG}=N_{1MWG}$, $N_{1SWG}=N_{2MWG}$, $N_{1MWG}=N_{2MWG}$.

More preferably, $N_{1SWG}=N_{1MWG}=N_{2MWG}$.

Most preferably, $N_{SUB}=N_{1SWG}=N_{1MWG}=N_{2MWG}$, as facilitating the fabrication of the devices.

The thickness of the first optical guide layer and the second optical guide layer may be defined in any desired manner. It may be suitably determined in consideration of the condition of light confinement in the laser waveguide. The optical guide layer may not be a single layer, but may have a super-lattice structure and may have a multi-layered structure. The refractive index of the optical guide layer may be changed inside the layer within a suitable range. Further, the conduction type of the optical guide layer may be defined in any desired manner. Preferably, the layer contains a first-conduction-type Si-containing part. The embodiment of the type is preferable since electrons may be fed from the doped Si in the first optical guide layer and/or the second optical guide layer, into the quantum well layer and the gain spectrum of the device may be broad-banded.

Figure 2:
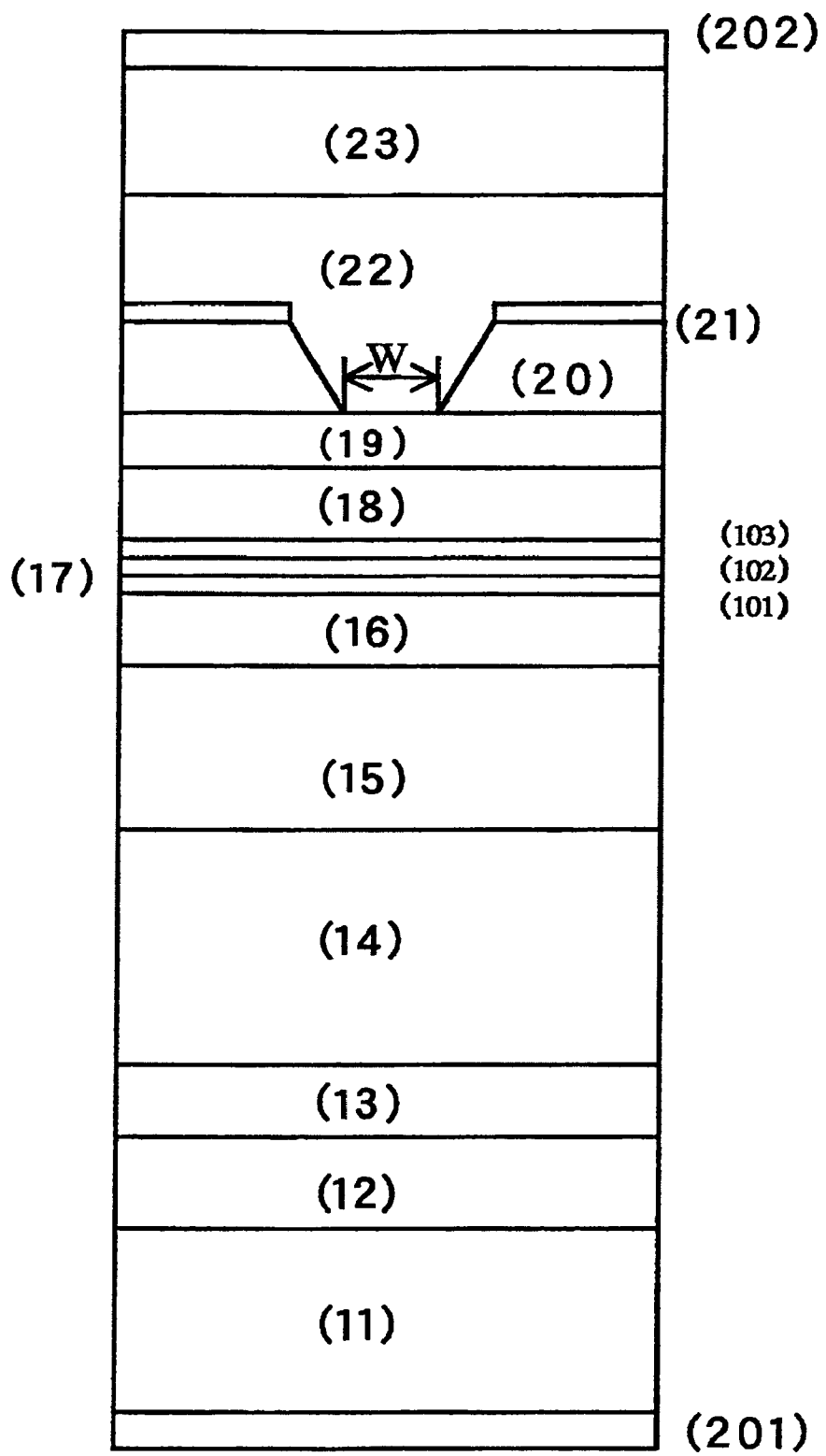
FIG. 2 is a schematic cross-sectional view of one example of the semiconductor laser of the invention.

When a device that requires transverse-mode control is fabricated or when a device in which the current injection path into the active layer structure is defined, as in FIG. 2, it is desirable that the second-conduction-type clad layer is designed to have a two-layered structure of a lower clad layer and an upper clad layer, and the upper clad layer and a current block layer form a current injection region. The method of the invention that stabilizes the oscillation wavelength against current and temperature change is especially effective to a device that has a Fabry-Perot cavity and gives single transverse-mode oscillation.

The lower second-conduction-type clad layer (19) and the upper second-conduction-type clad layer (22) constitute the laser waveguide along with the first-conduction-type clad layer/first optical guide layer/active layer structure/second optical guide layer. Accordingly, the refractive index $N_{2cld}$ of the second-conduction-type clad layer and the average refractive index $N_A$ of the active layer structure must satisfy the following:

$N_{2cld}<N_A$.

As described herein, when the second-conduction-type clad layer consists of a lower clad layer and an upper clad layer, then the refractive index $N_{2cld}$ of the second-conduction-type layer is given by dividing the sum total of the product of the refractive index and the thickness of every layer, by the sum total of the thickness of every layer, followed by averaging the resulting data.

The thickness of the second-conduction-type clad layer, or that is, the total of the thickness of the lower clad layer and the upper clad layer, $T_{2cld}$ (nm) may be suitably selected. However, since the second-conduction-type clad layer is desired to be effective for preventing as much as possible the light leakage into the contact layer that is to be formed on the clad layer, it is desirable that the thickness of the second-conduction-type clad layer satisfies the following, relative to the thickness $T_{1cld}$ (nm) of the first-conduction-type layer:

$T_{1cld}<T_{2cld}$.

From the viewpoint of the symmetrical configuration of the device, the refractive index $N_{1cld}$ of the first-conduction-type clad layer and the refractive index $N_{2cld}$ of the second-conduction-type clad layer preferably satisfy the following:

$N_{1cld}=N_{2cld}$.

A part of the second-conduction-type clad layer may be undoped, or the doping level in the layer may vary.

It is not always necessary that the first-conduction-type clad layer and the second-conduction-type clad layer have a single-layered structure for realizing various light confinement in the laser waveguide, and the layers may have a multi-layered structure. The second-conduction-type clad layer may partly have a super-lattice structure.

The first-conduction-type current block layer (20) has two functions. One function of the layer is literally to block current to thereby substantially control the current injection region; and another is suitably define its relative refractive index to the second-conduction-type clad layer to thereby realize light confinement in the horizontal direction in the layer.

For the former, it is desirable that the conduction type of the layer is the same as that of the first-conduction-type clad layer, or the layer is undoped.

In view of the latter, one method of realizing a single transverse-mode operation in the device structure as in FIG. 2 comprises making the refractive index of the current block layer smaller than that of the upper second-conduction-type clad layer to thereby form a waveguide structure in the horizontal direction inside the device. For example, when the upper second-conduction-type clad layer is formed of $Al_xGa_{1-x}As$ and the current block layer is formed of $Al_zGa_{1-z}As$, then x and y are defined to be x<z and light confinement in the horizontal direction in the device is thereby realized. In this case, it is desirable that the effective refractive index difference in the horizontal direction that is defined essentially by the refractive index difference between the current block layer and the upper second-conduction-type clad layer is on the order of $10^{-3}$. For a method of single transverse-mode operation, the current block layer may be formed of a material capable of absorbing a light having the oscillation wavelength of the device, and the device may be a loss guide-type one.

In addition, one important factor for single transverse-mode operation is that the width of W in FIG. 2, which corresponds to the width of the current injection region, is suitably controlled. When the invention is applied to a device for single transverse-mode operation, then the width of W is preferably from 1.5 µm to 3.5 µm or so.

Preferably, a cap layer (21) is formed on the current block layer. For the cap layer, a material is selected which protects the current block layer in fabricating the device and which facilitates the growth of the upper second-conduction-type clad layer/contact layer. Basically, the conduction type of the cap layer may be either a first conduction type or a second conduction type.

Preferably, a second-conduction-type contact layer (23) is formed on the upper second-conduction-type clad layer for the purpose of reducing the contact resistivity of the device with electrode. The contact layer is generally formed of a GaAs material. In general, the carrier concentration in the layer is made higher than in the other layers for reducing the contact resistivity of the layer with electrode. The thickness of the contact layer may be suitably selected.

The thickness of each layer to constitute the semiconductor laser may be suitably selected within the range capable of effectively exhibiting the function of each layer. In fabricating the structure illustrated, it is also possible to select a suitable crystal growth method in accordance with the thickness of each constitutive layer. The device may be fabricated as a whole according to a method of MBE or MOCVD. In particular, when the suitable thickness of the layer is over 10 μm, for example, when the subwaveguide layer is formed, then the intended layer may be selectively formed according to a method of LPE.

An epitaxial layer-side electrode (202) is further formed on the semiconductor laser of FIG. 2. This may be formed, for example, by depositing Ti/Pt/Au in order in a mode of evaporation on the surface of the second-conduction-type contact layer, followed by alloying the deposited metals.

In general, the process mentioned hereinabove enables production of a semiconductor laser by the use of a substrate having a thickness of 350 μm or so. The opposite surface of the substrate not coated with the semiconductor laser structure may be polished to remove the unnecessary thickness of the substrate, before an electrode is formed thereon. In the invention, the overall thickness of the device may be so designed that it sufficiently ensures the mechanical strength of the device not detracting from the cleavability thereof.

After polished, an electrode (201) is formed on the opposite side of the substrate. When this is formed on the surface of the first-conduction-type substrate and when this is an n-type electrode, then, for example, AuGe/Ni/Au is deposited on the surface of the substrate in order in a mode of evaporation and then alloyed to give the intended electrode.

A facet serving as a light going-out face is formed in the thus-fabricated semiconductor wafer. In the invention, light emission is not limited to edge emission. However, the invention is favorable to edge-emission-type devices. The facet serves as a mirror to constitute a cavity in a semiconductor device. The facet is preferably formed through cleavage. Cleavage is a method widely employed in the art. The facet to be formed through cleavage varies depending on the orientation of the substrate used. For example, when a substrate having a face that is crystallographically equivalent to nominal (100) favorably used in the art is used to produce an edge-emission-type laser device, then (110) or a face crystallographically equivalent to it is to be the face to form a cavity. On the other hand, when a miss-oriented substrate is used, then the facet could not be at 90 degrees in the cavity direction depending on the relationship between the inclined direction and the cavity direction. For example, when a substrate inclined by 2 degrees from the (100) plane towards the [1-10] direction is used, the facets will also incline by 2 degrees.

In the invention, it is desirable that a dielectric, or dielectric-semiconductor combined coating layer is formed on the exposed semiconductor facet of device. The coating layer is formed essentially for two purposes of increasing the light take-out efficiency from the semiconductor laser and protecting the facet of the device. For high-output operation of the device, asymmetric coating is desirable, which is as follows: A coating layer having a low reflectance (at most 10%) at the oscillation wavelength is formed on the front facet of the device, and a coating layer having a high reflectance (at least 80%) at the oscillation wavelength is formed on the back facet thereof.

Various materials may be used for the coating layer. For example, one or more selected from a group consisting of $AlO_x$, $TiO_x$, $SiO_x$, $SiN_x$, Si and ZnS are preferably used. For a low-reflectance coating layer, usable are $AlO_x$, $TiO_x$, $SiO_x$. For a high-reflectance coating layer, usable are a multi-layered film of $AlO_x/Si$, and a multi-layered film of $TiO_x/SiO_x$. The desired reflectance can be realized by controlling the film thickness. In general, however, the thickness of the low-reflectance coating layer of $AlO_x$, $TiO_x$ or $SiO_x$ is controlled to be around $\lambda/4n$ in which n indicates the real number part of the refractive index of the layer at a wavelength $\lambda$. Also, the high-reflectance multi-layered film is generally so controlled that the thickness of each layer to constitute the film could be around $\lambda/4n$.

The invention is described more concretely with reference to the following Examples. The material, the concentration, the thickness the operation protocol and others shown in the following Examples may be suitably changed and modified not overstepping the scope and the gist of the invention. Accordingly, the scope of the invention should not be limited to the Examples mentioned below.

EXAMPLE 1

A semiconductor laser of FIG. 2 was fabricated according to the process mentioned below.

On the (100) face of an Si-doped n-type GaAs substrate (11) having a carrier concentration of $1\times10^{18}$ cm$^{-3}$ (having a refractive index at 980 nm of 3.5252 and having a thickness of 350 μm), formed were an Si-doped n-type GaAs layer having a thickness of 0.5 μm and having a carrier concentration of $1\times10^{18}$ cm$^{-3}$ (having a refractive index at 980 nm of 3.5252) as a first-conduction-type buffer layer (12); an Si-doped n-type $Al_{0.5}Ga_{0.5}As$ layer having a thickness of 2.0 μm and having a carrier concentration of $1\times10^{18}$ cm$^{-3}$ (having a refractive index at 980 nm of 3.2512) as a first-conduction-type low-refractive-index layer (13); and an Si-doped n-type GaAs layer having a thickness of 3.0 μm and having a carrier concentration of $1\times10^{18}$ cm$^{-3}$ (having a refractive index at 980 nm of 3.5252) as a part of a first-conduction-type subwaveguide layer (14), in a mode of epitaxial growth according to a method of MBE.

Next, on the epitaxially-grown face of the substrate, formed was an Si-doped n-type GaAS layer having a thickness of about 40 μm and a carrier concentration of $5\times10^{17}$ cm$^{-3}$ (having a refractive index at 980 nm of 3.5252) as a part of a first-conduction-type subwaveguide layer (14) in a mode of crystal growth according to a method of LPE.

To confirm the thickness of the first-conduction-type subwaveguide layer (14) and to planarize the surface thereof, the crystal-grown surface of the layer formed through LPE was removed in a mechanochemical polishing mode, so that the total of the thickness of the first-conduction-type subwaveguide layer grown through MBE and the first-conduction-type subwaveguide layer grown through LPE could be 29 μm.

Next, the following layer was epitaxially grown on the surface of the structure according to a method of MBE. As a part of the first-conduction-type subwaveguide layer that serves also as a buffer for crystal growth, an Si-doped n-type GaAs layer having a thickness of 1.0 μm and a carrier concentration of $1\times10^{18}$ cm$^{-3}$ (having a refractive index at 980 nm of 3.5252) was formed in a mode of crystal growth, and the final thickness of the first-conduction-type subwaveguide layer was thereby 30.0 μm.

On this, the following layers were laminated in that order:

as a first-conduction-type clad layer (15), an Si-doped n-type $Al_{0.35}Ga_{0.65}As$ layer having a thickness of 1.35 μm and a carrier concentration of $1\times10^{18}$ cm$^{-3}$ (having a refractive index at 980 nm of 3.3346);

as a first optical guide layer (16), an Si-doped n-type GaAs layer having a thickness of 35 nm and a carrier concentration of $8\times10^{17}$ cm$^{-3}$ (having a refractive index at 980 nm of 3.5252);

as an active layer structure (17), an undoped $In_{0.16}Ga_{0.84}As$ strained quantum well layer (101) having a thickness of 6 nm, an Si-doped n-type GaAs barrier layer (102) having a thickness of 8 nm, and an undoped $In_{0.16}Ga_{0.84}As$ strained quantum well layer (103) having a thickness of 6 nm;

as a second optical guide layer (18), an Si-doped n-type GaAs layer having a thickness of 35 nm and a carrier concentration of $8\times10^{17}$ cm$^{-3}$ (having a refractive index at 980 nm of 3.5252);

as a lower second-conduction-type clad layer (19), a Be-doped p-type $Al_{0.35}Ga_{0.65}As$ layer having a thickness of 0.1 μm and a carrier concentration of $1\times10^{18}$ cm$^{-3}$ (having a refractive index at 980 nm of 3.3346);

as a first-conduction-type current block layer (20), an n-type $Al_{0.39}Ga_{0.61}As$ layer having a thickness of 0.5 μm and a carrier concentration of $5\times10^{17}$ cm$^{-3}$ (having a refractive index at 980 nm of 3.3069);

as a cap layer (21), an Si-doped n-type GaAs layer having a thickness of 10 nm and a carrier concentration of $1\times10^{18}$ cm$^{-3}$.

A mask of silicon nitride was formed in a part of the uppermost layer except the current injection region part thereof. In this step, the width of the opening of the silicon nitride mask was 1.5 μm. Next, using a mixture solution of sulfuric acid (98 wt. %), hydrogen peroxide (aqueous 30 wt. % solution) and water in a ratio by volume of 1/1/5, the cap layer (21) and the first-conduction-type current block layer (20) were etched at 25° C. for 27 seconds to such a degree that the etched depth could reach the lower second-conduction-type clad layer (19). Next, this was dipped in a mixture solution of HF (49%) and $NH_4F$ (40%) in a ratio of 1/6, for 2 minutes and 30 seconds to remove the silicon nitride layer.

Next, as an upper second-conduction-type clad layer (22), a Zn-doped p-type $Al_{0.35}Ga_{0.65}As$ layer having a carrier concentration of $1\times10^{18}$ cm$^{-3}$ (having a refractive index at 980 nm of 3.3346) was grown according to a method of MOCVD in such a manner that the thickness of the buried part (current injection region part) could be 2.5 μm. Further, a Zn-doped p-type GaAs layer having a carrier concentration of $6\times10^{18}$ cm$^{-3}$ (having a refractive index at 980 nm of 3.5252) was grown to have a thickness of 3.5 μm, as a second-conduction-type contact layer (23) for ensuring the contact of the structure with an electrode.

The width W of the current injection region (the width of the upper second-conduction-type clad layer in the interface to the lower second-conduction-type clad layer) was 2.2 μm. The refractive index difference between the first-conduction-type current block layer (20) and the upper second-conduction-type clad layer (22) and the width W were so planned that the waveguide mode could be a fundamental-mode alone.

Next, as a p-side electrode of an epitaxial layer-side electrode (202), Ti/Pt/Au were deposited in a mode of evaporation and alloyed at 400° C. for 5 minutes to complete an electrode structure.

Next, the face of the first-conduction-type substrate not coated with the epitaxial layer was polished so that the overall thickness of the device could be about 120 μm (in which the thickness of the substrate could be about 80 μm, disregarding extremely thin layers of first optical guide layer/active layer structure/second optical guide layer/cap layer).

Further, as an n-side electrode of a substrate-side electrode (201), AuGeNi/Au were deposited in a mode of evaporation and alloyed at 400° C. for 5 minutes to complete semiconductor wafer.

Next, this was cleaved in air to give a laser bar having a resonance wavelength of 700 μm, and the (110) face thereof was exposed out. Next, a coating layer of an AlOx film having a thickness of 165 nm was formed in vacuum so that the reflectance of the front facet of the device could be 2.5% at an oscillation wavelength of 980 nm.

Further, for processing the back facet side thereof, the laser bar was once taken out of the vacuum chamber. A four-layered coating layer of 170 nm-thick AlOx layer/60 nm-thick amorphous Si layer/170 nm-thick AlOx layer/60 nm-thick amorphous Si layer was formed on the back facet, and the thus-coated back facet had a reflectance of 92%.

Figure 3:
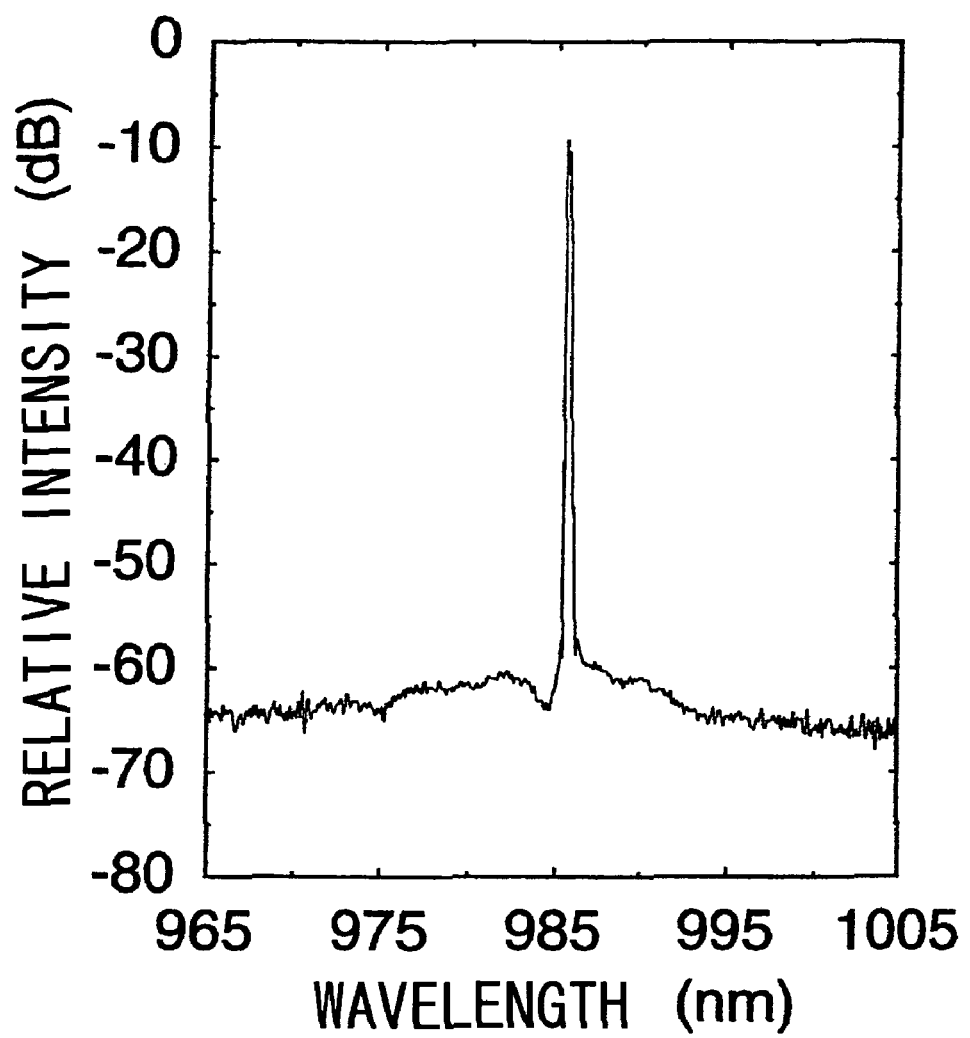
FIG. 3 is an oscillation spectrum of the semiconductor laser of Example.

Thus fabricated, the semiconductor laser was analyzed for the oscillation spectrum thereof at 25° C. and at 82.3 mA, 148.3 mA, 221.2 mA and 301.3 mA. FIG. 3 shows the oscillation spectrum of the device with a current of 221.2 mA injected thereinto, and this confirms the extremely stable longitudinal-mode oscillation of the device. It may be considered that, from the relationship between the intensity modulation period which could be mathematically estimated to be about 10 nm as a result of coupling of the laser waveguide and the subwaveguide having a thickness of 30 μm, and the laser gain spectrum, one longitudinal-mode could be selectively observed. FIG. 4 is a graph given by plotting the current dependency of the longitudinal-mode wavelength that shows the maximum intensity in the oscillation spectrum within the above-mentioned current injection. In the drawing, the black spots indicate the experimental data. The oscillation wavelength became slightly shortened with the increase in the current from 82.3 mA to 301.3 mA. However, the wavelength fluctuation was about 1.5 nm and was extremely small.

COMPARATIVE EXAMPLE 1

A semiconductor laser was fabricated in the same manner as in Example 1 except for the following: The first-conduction-type low-refractive-index layer (13) formed through MBE and the first-conduction-type subwaveguide layer (14) formed through MBE and LPE were omitted; the other layers up to the cap layer (21) were continuously grown on the substrate through MBE; and the thickness of the first-conduction-type clad layer (15) and the second-conduction-type clad layer (22) was 1.5 μm.

Figure 5:
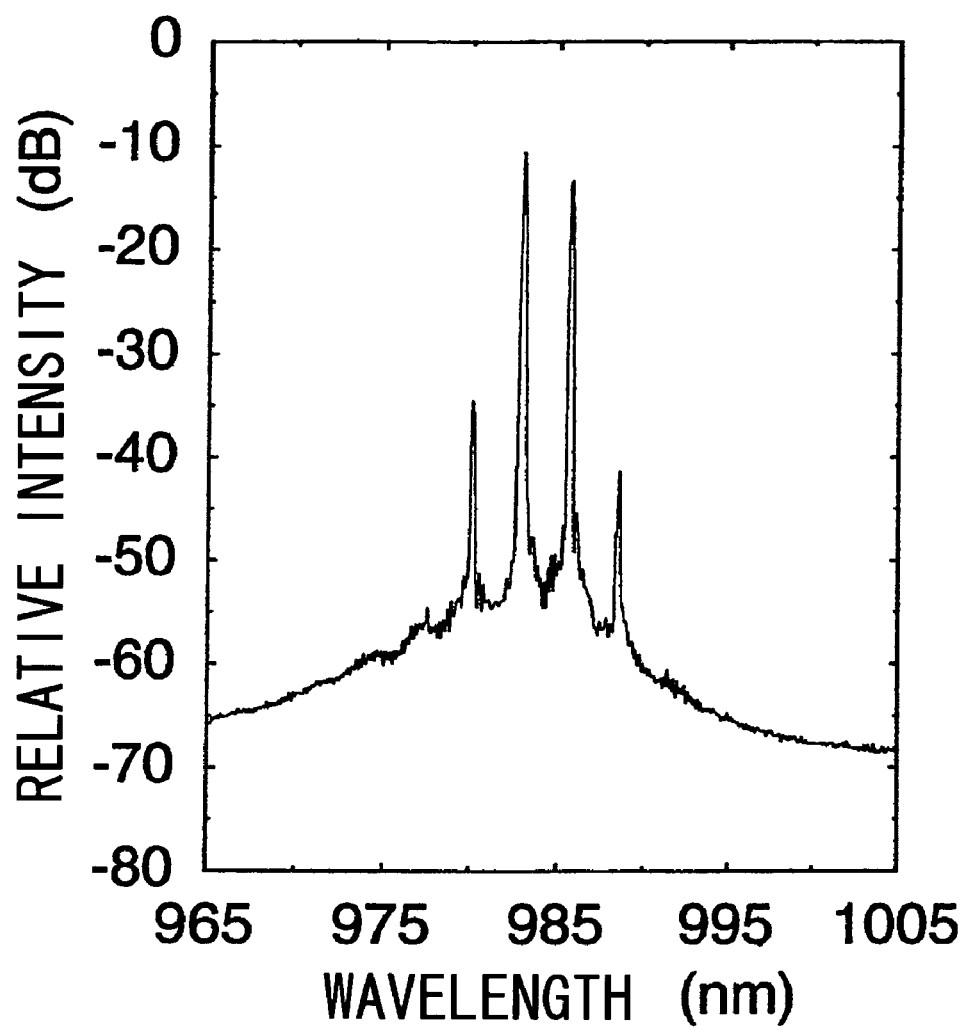
FIG. 5 is an oscillation spectrum of the semiconductor laser of Comparative Example 1.
Figure 6:
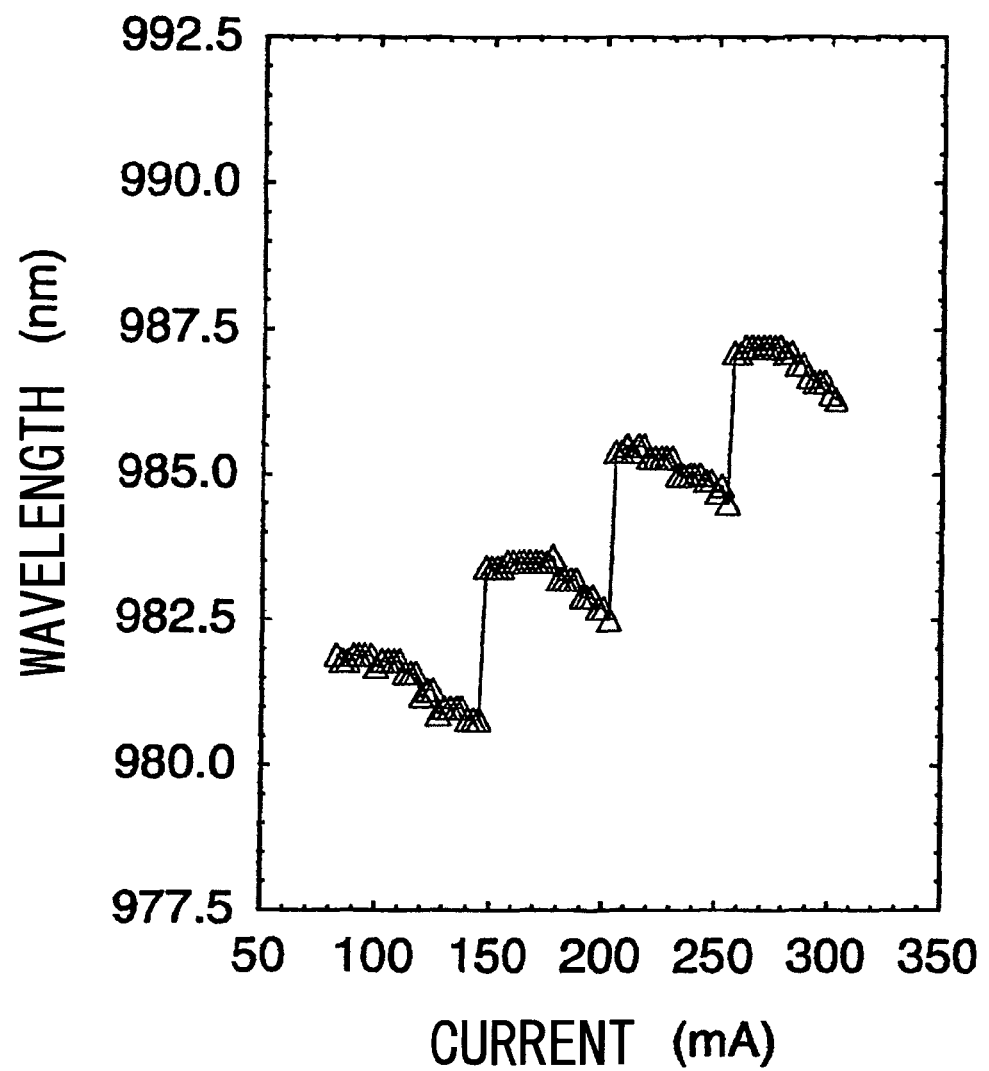
FIG. 6 is a graph showing the current dependency of the longitudinal-mode wavelength that shows the maximum intensity in the oscillation spectrum of the semiconductor laser of Comparative Example 1.

Thus fabricated, the semiconductor laser was analyzed in detail for the oscillation spectrum characteristics thereof, at 25° C. and at current intervals of 2.5 mA within a range of from 82.5 mA to 302.5 mA. FIG. 5 shows the oscillation spectrum of the device with a current of 195 mA injected thereinto, and this confirms the influence of the intensity modulation superimposed on the oscillation spectrum at intervals of about 2.9 nm. This may be because of the result of coupling of the laser waveguide to the substrate that expresses a waveguide function and has a thickness of about 112 μm. FIG. 6 is a graph given by plotting the current dependency of the longitudinal-mode wavelength that shows the maximum intensity in the oscillation spectrum within the above-mentioned current injection. In the drawing, the open triangles indicate the experimental data. The oscillation wavelength pattern showed a specific step-like profile with the increase in the current from 82.5 mA to 302.5 mA. In the current range, the difference between the maximum value (987.2 nm) and the minimum value (980.9 nm) was 6.3 nm, and the wavelength fluctuation within the range was very large.

COMPARATIVE EXAMPLE 2

A semiconductor laser was fabricated in the same manner as in Example 1 except for the following: The first-conduction-type low-refractive-index layer (13) formed through MBE and the first-conduction-type subwaveguide layer (14) formed through MBE and LPE were omitted; the other layers up to the cap layer (21) were continuously grown on the substrate through MBE; and the thickness of the first-conduction-type clad layer (15) and the second-conduction-type clad layer (22) was 2.5 μm.

Figure 8:
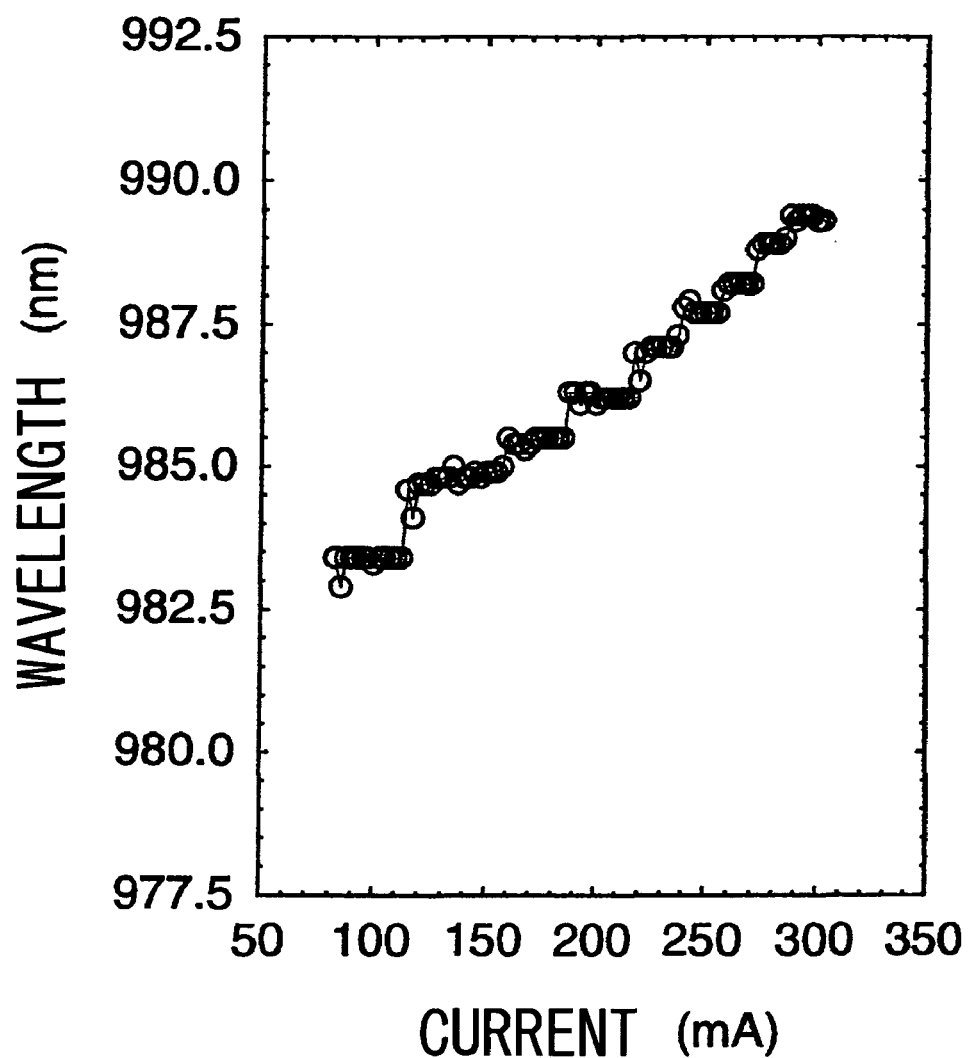
FIG. 8 is a graph showing the current dependency of the longitudinal-mode wavelength that shows the maximum intensity in the oscillation spectrum of the semiconductor laser of Comparative Example 2.

Thus fabricated, the semiconductor laser was analyzed in detail for the oscillation spectrum characteristics thereof, at 25° C. and at current intervals of 2.5 mA within a range of from 82.5 mA to 302.5 mA. FIG. 7 shows the oscillation spectrum of the device with a current of 192.5 mA injected thereinto, and this confirms no influence of the intensity modulation on the oscillation spectrum. This may be because the first-conduction-type clad layer is sufficiently thick and therefore the laser waveguide would not couple to the waveguide function-having substrate. FIG. 8 is a graph given by plotting the current dependency of the longitudinal-mode wavelength that shows the maximum intensity in the oscillation spectrum within the above-mentioned current injection. In the drawing, the open circles indicate the experimental data. The oscillation wavelength simply increased as a whole with the increase in the current from 82.5 mA to 302.5 mA. In the current range, the difference between the maximum value (989.4 nm) and the minimum value (982.9 nm) was 6.5 nm, and the wavelength fluctuation within the range was very large.

The invention makes it possible to realize a semiconductor laser which can be fabricated in a simple method and which has a stable oscillation wavelength against the changes of current/light output/temperature.

The present disclosure relates to the subject matter contained in PCT/JP2003/011488 filed on Sep. 9, 2003 and Japanese Patent Application No. 275917/2002 filed on Sep. 20, 2002, which are expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

What is claimed is:

1. A semiconductor laser having an oscillation wavelength λ (nm) and comprising at least a substrate, a first-conduction-type clad layer having an average refractive index $N_{1cld}$, an active layer structure having an average refractive index $N_A$, a second-conduction-type clad layer having an average refractive index $N_{2cld}$, wherein a first-conduction-type subwaveguide layer having an average refractive index $N_{1SWG}$ is present between the substrate and the first-conduction-type clad layer, a first-conduction-type low-refractive-index layer having an average refractive index $N_{1LiL}$ is present between the subwaveguide layer and the substrate, these refractive indexes satisfy all the following formulae:

$N_{1cld} < N_A$, $N_{2cld} < N_A$, $N_{1cld} < N_{1SWG}$, $N_{2cld} < N_{1SWG}$, $N_{1LIL} < N_{1SWG}$, and wherein the first-conduction-type subwaveguide layer is configured such that, when an input current is increased, a red-shift of the longitudinal-mode due to a red-shift of the gain spectrum in the active layer structure is inhibited by the plasma effect of reducing the refractive index of the subwaveguide layer.

2. The semiconductor laser as claimed in claim 1, wherein the refractive indexes satisfy all the following formulae:

$N_{1LIL} \leq N_{1cld}$, $N_{1LIL} \leq N_{2cld}$.

3. The semiconductor laser as claimed in claim 1, wherein the thickness $T_{1cld}$ (nm) of the first-conduction-type clad layer satisfies the following formula:

$0.5 < T_{1cld}/\lambda < 3.0$.

4. The semiconductor laser as claimed in claim 1, wherein the thickness $T_{1cld}$ (nm) of the first-conduction-type clad layer and the thickness $T_{2cld}$ (nm) of the second-conduction-type clad layer satisfy the following formula:

$T_{1cld} < T_{2cld}$.

5. The semiconductor laser as claimed in claim 1, wherein the thickness $T_{1SWG}$ (nm) of the first-conduction-type subwaveguide layer satisfies the following formula:

2000 (nm) $< T_{1SWG} <$ 40000 (nm).

6. The semiconductor laser as claimed in claim 1, wherein the thickness $T_{1LIL}$ (nm) of the first-conduction-type low-refractive-index layer satisfies the following formula:

500 (nm) $< T_{1LIL} <$ 20000 (nm).

7. The semiconductor laser as claimed in claim 1, wherein the substrate is transparent to a light having the oscillation wavelength λ (nm).

8. The semiconductor laser as claimed in claim 7, wherein the refractive index $N_{sub}$ of the substrate satisfies the following formula:

$N_{1LIL} < N_{sub}$.

9. The semiconductor laser as claimed in claim 1, wherein the substrate absorbs a light having the oscillation wavelength λ (nm).

10. The semiconductor laser as claimed in claim 1, wherein the thickness $T_{sub}$ (nm) of the substrate satisfies the following formula:

75000 (nm) $< T_{SUB} <$ 135000 (nm).

11. The semiconductor laser as claimed in claim 1, which is an edge-emission-type device having a facet-reflection-type cavity structure.

12. The semiconductor laser as claimed in claim 1, wherein any or all of the substrate, first-conduction-type low-refractive-index layer, first-conduction-type subwaveguide layer, first-conduction-type clad layer or second-conduction-type clad layer comprise a compound that contains Ga and As.

13. The semiconductor laser as claimed in claim 1, wherein the active layer structure includes a strained quantum well layer that contains In, Ga and As.

14. The semiconductor laser as claimed in claim 1, wherein the active layer structure includes a quantum well layer that contains Al, Ga and As.

15. The semiconductor laser as claimed in claim 1, which comprises a first optical guide layer having a refractive index $N_{1MWG}$ between the first-conduction-type clad layer and the active layer structure; and a second optical guide layer having a refractive index $N_{N2MWG}$ between the active layer structure and the second-conduction-type clad layer, wherein these refractive indexes satisfy all the following formulae:

$$N_{1cld} < N_{1MWG} < N_A,$$

$$N_{2cld} < N_{1MWG} < N_A,$$

$$N_{1cld} < N_{2MWG} < N_A,$$

$$N_{2cld} < N_{2MWG} < N_A.$$

16. The semiconductor laser as claimed in claim 15, which satisfies all the following formulae:

$$N_{1SWG} \leqq N_{1MWG},$$

$$N_{1SWG} \leqq N_{2MWG}.$$

17. The semiconductor laser as claimed in claim 15, wherein the refractive index $N_{SUB}$ of the substrate at the laser oscillation wavelength $\lambda$ (nm) satisfies at least one of the following formulae:

$$N_{SUB} = N_{1SWG},$$

$$N_{SUB} = N_{1MWG},$$

$$N_{SUB} = N_{2MWG},$$

$$N_{1SWG} = N_{1MWG},$$

$$N_{1SWG} = N_{2MWG},$$

$$N_{1MWG} = N_{2MWG}.$$

18. The semiconductor laser as claimed in claim 15, wherein at least one of the first optical guide layer and the second optical guide layer contains Ga and As.

19. The semiconductor laser as claimed in claim 1, wherein the second-conduction-type clad layer consists of an upper second-conduction-type clad layer and a lower second-conduction-type clad layer, and the upper second-conduction-type clad layer and a current block layer form a current injection region, and the semiconductor laser further includes a contact layer.

20. The semiconductor laser as claimed in claim 1, which operates in a single transverse-mode.

21. The semiconductor laser as claimed in claim 1, wherein the first conduction type is an n-type and the second conduction type is a p-type.

22. A semiconductor laser having an oscillation wavelength $\lambda$ (nm) and comprising at least a substrate, a first-conduction-type clad layer having an average refractive index $N_{1cld}$, an active layer structure having an average refractive index $N_A$, and a second-conduction-type clad layer having an average refractive index $N_{2cld}$, wherein a first-conduction-type subwaveguide layer having an average refractive index $N_{1SWG}$ is present between the substrate and the first-conduction-type clad layer, a first-conduction-type low-refractive-index layer having an average refractive index $N_{1LIL}$ is present between the subwaveguide layer and the substrate, these refractive indexes satisfy all the following formulae:

$$N_{1cld} < N_A,$$

$$N_{2cld} < N_A,$$

$$N_{1cld} < N_{1SWG},$$

$$N_{2cld} < N_{1SWG},$$

$$N_{1LIL} < N_{1SWG}, \text{ and}$$

wherein the first-conduction-type subwaveguide layer is configured such that, when temperature increases, red-shift of the gain spectrum that is generated in the active layer structure is inhibited since the effect of red-shift of the oscillation wavelength owing to increase of the refractive index of the subwaveguide layer by the temperature increase is smaller than the effect of red-shift of the oscillation wavelength owing to the reduction in the band gap of the active layer.

23. The semiconductor laser as claimed in claim 22, wherein the refractive indexes satisfy all the following formulae:

$$N_{1LIL} \leqq N_{1cld},$$

$$N_{1LIL} \leqq N_{2cld}.$$

24. The semiconductor laser as claimed in claim 22, wherein the thickness $T_{1cld}$ (nm) of the first-conduction-type clad layer satisfies the following formula:

$$9.5 < T_{1cld}/\lambda < 3.0.$$

25. The semiconductor laser as claimed in claim 22, wherein the thickness $T_{1cld}$ (nm) of the first-conduction-type clad layer and the thickness $T_{2cld}$ (nm) of the second-conduction-type clad layer satisfy the following formula:

$$T_{1cld} < T_{2cld}.$$

26. The semiconductor laser as claimed in claim 22, wherein the thickness $T_{1SWG}$ (nm) of the first-conduction-type subwaveguide layer satisfies the following formula:

$$2000 \text{ (nm)} < T_{1SWG} < 40000 \text{ (nm)}.$$

27. The semiconductor laser as claimed in claim 22, wherein the thickness $T_{1LIL}$ (nm) of the first-conduction-type low-refractive-index layer satisfies the following formula:

$$500 \text{(nm)} < T_{1LIL} < 20000 \text{ (nm)}.$$

28. The semiconductor laser as claimed in claim 22, wherein the substrate is transparent to a light having the oscillation wavelength $\lambda$ (nm).

29. The semiconductor laser as claimed in claim 28, wherein the refractive index $N_{sub}$ of the substrate satisfies the following formula:

$$N_{1LIL} < N_{sub}.$$

30. The semiconductor laser as claimed in claim 22, wherein the substrate absorbs a light having the oscillation wavelength $\lambda$ (nm).

31. The semiconductor laser as claimed in claim 22, wherein the thickness $T_{sub}$ (nm) of the substrate satisfies the following formula:

$$75000 \text{ (nm)} < T_{SUB} < 135000 \text{ (nm)}.$$

32. The semiconductor laser as claimed in claim 22, which is an edge-emission-type device having a facet-reflection-type cavity structure.

33. The semiconductor laser as claimed in claim 22, wherein any or all of the substrate, first-conduction-type low-refractive-index layer, first-conduction-type subwaveguide layer, first-conduction-type clad layer or second-conduction-type clad layer comprise a compound that contains Ga and As.

34. The semiconductor laser as claimed in claim 22, wherein the active layer structure includes a strained quantum well layer that contains In, Ga and As.

35. The semiconductor laser as claimed in claim 22, wherein the active layer structure includes a quantum well layer that contains Al, Ga and As.

36. The semiconductor laser as claimed in claim 22, which comprises a first optical guide layer having a refractive index $N_{1MWG}$ between the first-conduction-type clad layer and the active layer structure; and a second optical guide layer having a refractive index $N_{N2MWG}$ between the active layer structure and the second-conduction-type clad layer, wherein these refractive indexes satisfy all the following formulae:

$$N_{1cld} < N_{1MWG} < N_A,$$

$$N_{2cld} < N_{1MWG} < N_A,$$

$$N_{1cld} < N_{2MWG} < N_A,$$

$$N_{2cld} < N_{2MWG} < N_A.$$

37. The semiconductor laser as claimed in claim 36, which satisfies all the following formulae:

$$N_{1SWG} \leqq N_{1MWG},$$

$$N_{1SWG} \leqq N_{2MWG}.$$

38. The semiconductor laser as claimed in claim 36, wherein the refractive index $N_{SUB}$ of the substrate at the laser oscillation wavelength λ (nm) satisfies at least one of the following formulae:

$$N_{SUB} = N_{1SWG},$$

$$N_{SUB} = N_{1MWG},$$

$$N_{SUB} = N_{2MWG},$$

$$N_{1SWG} = N_{1MWG},$$

$$N_{1SWG} = N_{2MWG},$$

$$N_{1MWG} = N_{2MWG}.$$

39. The semiconductor laser as claimed in claim 36, wherein at least one of the first optical guide layer and the second optical guide layer contains Ga and As.

40. The semiconductor laser as claimed in claim 22, wherein the second-conduction-type clad layer consists of an upper second-conduction-type clad layer and a lower second-conduction-type clad layer, and the upper second-conduction-type clad layer and a current block layer form a current injection region, and the semiconductor laser further includes a contact layer.

41. The semiconductor laser as claimed in claim 22, which operates in a single transverse-mode.

42. The semiconductor laser as claimed in claim 22, wherein the first conduction type is an n-type and the second conduction type is a p-type.

43. A semiconductor laser having an oscillation wavelength λ (nm) and comprising at least a substrate, a first-conduction-type clad layer having an average refractive index $N_{1cld}$, an active layer structure having an average refractive index $N_A$, and a second-conduction-type clad layer having an average refractive index $N_{2cld}$, wherein a first-conduction-type subwaveguide layer having an average refractive index $N_{1SWG}$ is present between the substrate and the first-conduction-type clad layer, a first-conduction-type low-refractive-index layer having an average refractive index $N_{1LIL}$ is present between the subwaveguide layer and the substrate, these refractive indexes satisfy all the following formulae:

$$N_{1cld} < N_A,$$

$$N_{2cld} < N_A,$$

$$N_{1cld} < N_{1SWG},$$

$$N_{2cld} < N_{1SWG},$$

$$N_{1LIL} < N_{1SWG}, \text{ and}$$

the thickness $T_{1SWG}$ (nm) of the first-conduction-type subwaveguide layer satisfies the following formula:

$$2000 \text{ (nm)} < T_{1SWG} < 40000 \text{ (nm)}, \text{ and}$$

wherein the first-conduction-type subwaveguide layer is configured such that, when temperature increases, red-shift of the gain spectrum that is generated in the active layer structure is inhibited since the effect of red-shift of the oscillation wavelength owing to increase of the refractive index of the subwaveguide layer by the temperature increase is smaller than the effect of red-shift of the oscillation wavelength owing to the reduction in the band gap of the active layer.

\* \* \* \* \*